Nov. 7, 1967 F. HULLIGER 3,351,435
SEMICONDUCTORS AND DEVICES EMPLOYING THE SAME
Filed Aug. 30, 1963
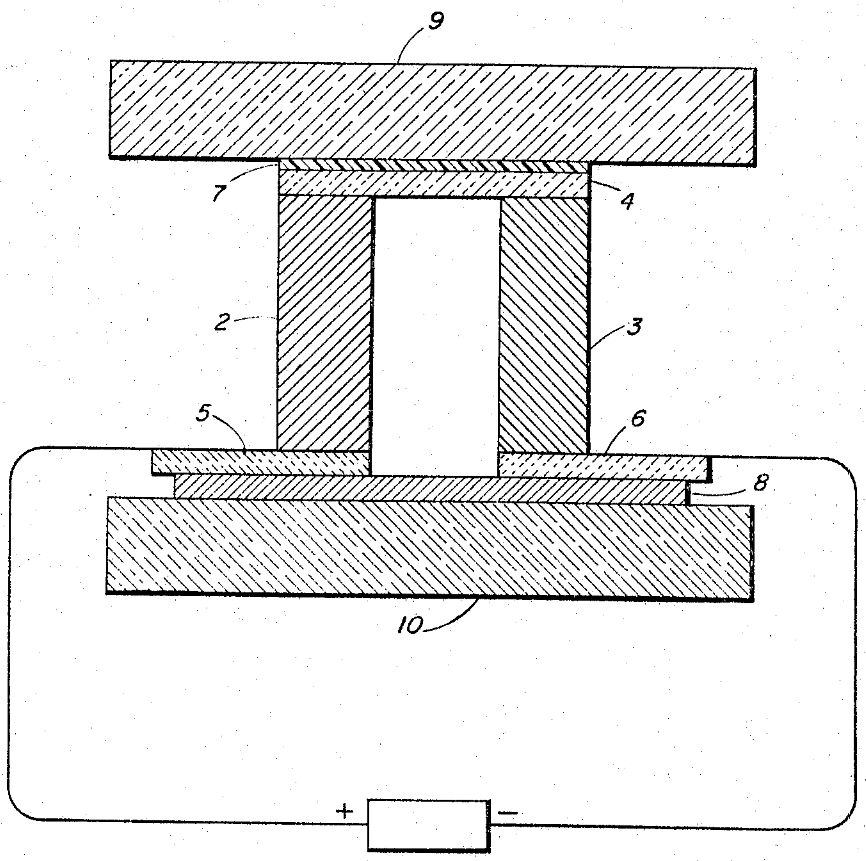
INVENTOR.
FRITZ HULLIGER
BY John E. Hinsdale [signature]
ATTORNEY United States Patent Office 3,351,435

Patented Nov. 7, 1967

3,351,435

SEMICONDUCTORS AND DEVICES EMPLOYING THE SAME

Fritz Hulliger, Uerikon, Zurich, Switzerland, assignor to American Cyanamid Company, Stamford, Conn., a corporation of Maine Filed Aug. 30, 1963, Ser. No. 305,600
10 Claims. (Cl. 23—315)

This invention relates to semiconducting compounds and their use in solid state semiconductor devices. More particularly, the present invention relates to the use of binary and ternary phases or compounds containing transition elements in solid state semiconductor devices.

Solid state semiconductor devices are in general well known and are characterized by a body, in most cases crystalline or even monocrystalline, of an electrically conducting substance which is subjected to electrical or magnetic fields, to corpuscular or wave radiation, or to a plurality of such phenomena for producing electrical, photoelectrical, optical or other physical effects. Typically, such devices include transistors, thermistors, rectifiers, diodes, photocells, photoconductors, radiation detectors, thermocouples, thermoelectric generators, and Peltier cooling cells, among others.

It is the principal object of this invention to provide solid state semiconductor devices employing transition element compounds, some of which are known and some of which are novel and to provide new devices heretofore unavailable.

This and other objects and advantages of the invention will become more apparent from the detailed description thereof set forth hereinbelow in conjunction with the accompanying drawing, the single feature of which is in plan view, and demonstrates the use of semiconductors of this invention in a thermoelectric device.

According to this invention, a semiconductor device is provided comprising a semiconducting element and circuit means electrically connected therewith, which element comprises a compound of the formula $$MX_1X_2$$

where M is selected from the group consisting of Ru, Os and $Cr_ZFe_{1-Z}$ where Z is a value of from 0 to .5, $X_1$ and $X_2$ are selected from the group consisting of P, As and Sb.

Among the semiconducting compounds of the class exemplified by the above formula, the following are illustrative: $RuP_2$, RuPAs, $RuAs_2$, RuAsSb, $RuSb_2$, $OsP_2$, OsPAs, $OsAs_2$, $OsSb_2$ and $CrFeAs_4$.

The transition element compounds of this invention may be prepared by fusing or by sintering pressed pellets. In the fusing of compounds, the elements in stoichiometric quantities are thoroughly mixed, placed in a crucible and heated above the melting point for several minutes. In the sintering of the compounds, the powdered components of the elements in stoichiometric amounts are pressed into pellets of 8 millimeters in diameter by applying a pressure of about 5 tons. The pellets are then heated in evacuated sealed quartz tubes at temperatures of from 700 to 950° C. for as long as one or two months. In many instances, this sintering procedure was sufficient to obtain homogeneous samples in the form of gray dense pellets. Normally, the quality of the pellets can be improved by regrinding and resintering the pellets prepared in an initial run.

In order to illustrate the preparation of the semiconductors employed in the present invention, the following examples are given primarily by way of illustration. No specific details or enumerations contained therein should be construed as limitations on the present invention except insofar as they appear in the appended claims. All parts and percentages are by weight unless otherwise specifically designated.

EXAMPLE 1

In the preparation of 1/100–2/100 mole samples of RuAsSb, Ru powder of 99.9% plus purity and a particle size of less than 70μ was intimately mixed with 99.99% pure As and Sb powder and pressed into a pellet employing 5 tons of pressure. The pellet was sealed into an evacuated quartz glass ampoule, 8.5–9 mm. inner diameter and 1–1.5 mm. of wall thickness, and heated carefully in a flame. After the reaction had taken place, the temperature of the flame was raised to the temperature where weakening of the quartz glass began. At this temperature the contents of the ampoule were molten.

EXAMPLE 2

In the preparation of RuPAs technical grade P, purified following the method given in G. Brauer (Handbuch der Präparativen Anorganischen Chemie [Ferdinand Enke Verlag Stuttgart] Bd. 1, 1960, p. 466) was used. The elements were employed in stoichiometric amounts sufficient to produce 1/100 mole of product. The mixed elements (positioned in the ampoule) were pressed and the temperature slowly raised from 400° to 750° C. (within a couple of days) and was maintained at 750° C. for about 1 month. This procedure yielded a powder which had to be pressed for use.

EXAMPLE 3

In the preparation of OsPAs, the same procedure as was employed in Example 2 was employed, except that the sintering was carried out at a temperature of 800° C.

EXAMPLE 4

In the preparation of $CrFeAs_4$, Cr and Fe powder of about 99.9% purity were used with As of 99.99% purity in amounts sufficient to provide 1/100 mole of product. The thoroughly mixed elements were pressed into a single pellet which maintained its form after sintering in the ampoule at 750° C. for 3 weeks.

Employing the procedures outlined and specifically reported in the examples above, the following compounds were prepared and their lattice constants and Seebeck coefficients measured.

SEMICONDUCTING COMPOUNDS

| | S(μv./° C.) | Type of Conductance | Lattice constant (A.) |
|---|---|---|---|
| $RuP_2$ | 350 | (n) | ------ |
| RuPAs | 400 | (n) | a 5.26, b 6.04, c 2.92 |
| $RuAs_2$ | 350 | (n) | a 5.43, b 6.18, c 2.97 |
| RuAsSb | 300 | (n) | a 5.76, b 6.48, c 3.10 |
| $RuSb_2$ | 250 | (n) | ------ |
| OsPAs | ------ | ------ | a 5.24, b 6.02, c 2.96 |
| $OsAs_2$ | ------ | ------ | a 5.41, b 6.19, c 3.01 |
| $OsSb_2$ | 200 | (n) | ------ |
| $CrFeAs_4$ | 250 | (n) | a 5.37, b 6.13, c 2.93 |

The lattice constants recorded in the above table were obtained by X-ray analyses which were carried out on a Siemens Kristalloflex 4 with a goniometer.

The Seebeck coefficient was measured at room temperature by pressing a cold probe and a hot probe on the sample and measuring the resulting voltage and then calibrating against a substance of known thermoelectric power, in this case $SnSe_2$, 550 μv./° C. and $IrSb_3$, 200 μv./° C.

Since the electrical properties of some of the intermetallic transition metal compounds contemplated for use in accordance with this invention may be affected by departure from exact stoichiometric conditions, raw materials of the highest purity should be employed. Influencing of the electric properties may be achieved deliberately, in some instances by the inclusion of various impurities or dopes or intended departure from exact stoichiometry. In many instances, the compounds or phases contemplated may be produced in the form of crystals within or from a melt.

As is known, semiconductors which have successive zones of different electrical properties are of particular significance for various practical applications. For instance, a semiconductor crystal which in one zone is an excess electron (n-type) conductor and in the adjacent zone a defect-electron conductor (hole conductor, p-type) is in general suited as a rectifier. Further, a semiconductor having an excess electron conductance or n-type zone followed by a defect-electron conductance or p-type zone and again followed by a n-type zone is useful as a controllable resistor. In this respect, reference is made to those devices known as transistors.

As will be seen from the table above, the compounds identified demonstrate n-type conduction. These may be combined with compounds, phases or complexes known to demonstrate p-type conduction of the prior art and employed in devices of the type identified above. In forming new semiconducting devices, the intermetallic transition element phases or compounds of this invention are introduced into the device so as to have both p- and n-type conductors therein, which device is connected to circuit means which are electrically connected therewith.

Illustratively, in a thermoelectric device, as for refrigeration by the Peltier effect, it is desired to use semiconductor materials of the highest possible electrical conductivity, the highest possible Seebeck coefficient, and the lowest possible thermal conductivity, so as to maximize the expression $$Z=S^2\sigma/K$$

where S is Seebeck coefficient, $\sigma$ is electrical conductivity, K is thermal conductivity and Z is the thermoelectric figure of merit, well known in the art to be the essential design parameter whose value is desired to be as large as possible.

In order to produce a thermoelectric device, both n- and p-type semiconductor materials are most desirably employed in combination. Referring to the drawing, an n-type semiconductor such as RuAsSb 2 and a p-type semiconductor such as $Bi_2Te_3$ 3 are connected electrically by an electrical conductor connector 4. Electrical conductors 5 and 6 are attached to semiconductors 2 and 3, respectively, and to the positive and negative electrodes of a DC power source. Thermally conductive electrical insulator 7 is in contact with electrical conductor 4 and cold junction 9 while thermally conductive electrical insulator 8 is in contact with electrical conductors 5 and 6 and hot junction 10. When DC electrical power of the proper polarity is applied to the conductors 5 and 6, heat will be withdrawn from the body 9 and transferred to the body 10. A number of such thermoelectric heat pumping elements may be connected together in series or parallel manner so as to provide heat pumping capacities for refrigerating devices capable of cooling small parts, such as power transistors, or large freezing units, such as domestic food freezers.

I claim:

1. A semiconductor device comprising a semiconducting element and circuit means electrically connected therewith, said semiconducting element comprising a compound of the formula $$MX_1X_2$$

where M is selected from the group consisting of Ru, Os and $Cr_ZFe_{1-Z}$ where Z is a value of from 0 to .5, $X_1$ and $X_2$ are selected from the group consisting of P, As and Sb.

2. The semiconductor device of claim 1 wherein the semiconducting element is RuPAs.

3. The semiconductor device of claim 1 wherein the semiconducting element is RuAsSb.

4. The semiconductor device of claim 1 wherein the semiconducting element is OsPAs.

5. The semiconductor device of claim 1 wherein the semiconducting element is $CrFeAs_4$.

6. As a new composition of matter a semiconductor selected from the group consisting of RuPAs, RuAsSb, OsPAs and $CrFeAs_4$.

7. The composition of claim 6 which is RuPAs.

8. The composition of claim 6 which is RuAsSb.

9. The composition of claim 6 which is OsPAs.

10. The composition of claim 6 which is $CrFeAs_4$.

References Cited

UNITED STATES PATENTS

| | | | |
|---|---|---|---|
| 2,944,975 | 7/1960 | Folberth | 23—315 |
| 3,023,079 | 2/1962 | Kulifay | 23—204 |
| 3,211,517 | 10/1965 | Castellion | 23—315 |

OTHER REFERENCES

Hansen: Constitution of Binary Alloys, second ed., McGraw-Hill Book Company, Inc., New York, 1958, pages 176, 1087, 1080, 160, 162–164.

OSCAR R. VERTIZ, *Primary Examiner.*

H. S. MILLER, *Assistant Examiner.*